(12) United States Patent
Lebovitz et al.

(10) Patent No.: US 12,414,260 B2
(45) Date of Patent: Sep. 9, 2025

(54) CONTROLLER FOR UNMANNED AERIAL VEHICLES

(71) Applicant: Skydio, Inc., Redwood City, CA (US)

(72) Inventors: Adam Nathan Lebovitz, San Mateo, CA (US); Benjamin Scott Thompson, San Carlos, CA (US); Kellen James Waterman O'Rourke, Belmont, CA (US)

(73) Assignee: Skydio, Inc., San Mateo, CA (US)

( * ) Notice: Subject to any disclaimer, the term of this patent is extended or adjusted under 35 U.S.C. 154(b) by 362 days.

(21) Appl. No.: 17/862,799

(22) Filed: Jul. 12, 2022

(65) Prior Publication Data

US 2023/0261359 A1     Aug. 17, 2023

Related U.S. Application Data

(60) Provisional application No. 63/309,848, filed on Feb. 14, 2022.

(51) Int. Cl.
| | |
|---|---|
| H05K 7/20 | (2006.01) |
| G05D 1/00 | (2024.01) |
| G05D 1/221 | (2024.01) |
| H01Q 1/12 | (2006.01) |
| H01Q 21/28 | (2006.01) |

(Continued)

(52) U.S. Cl.
CPC ......... H05K 7/20163 (2013.01); G05D 1/221 (2024.01); H01Q 1/1235 (2013.01);
(Continued)

(58) Field of Classification Search
CPC .......... H05K 7/20163; H05K 7/20136; H05K 7/2039; H05K 5/00; H05K 7/00;
(Continued)

(56) References Cited

U.S. PATENT DOCUMENTS 6,097,595 A * 8/2000 Cipolla ................... G06F 1/166
                                                         248/688
11,226,617 B2 * 1/2022 Deng .................... G05D 1/0016
(Continued)

FOREIGN PATENT DOCUMENTS

CN          208300209 U   *  12/2018
CN          112771590 A   *   5/2021  ............. G08C 17/02

OTHER PUBLICATIONS

Ricker, Ed, "Experiencing DJI's Smart Controller—What's There to Like?", Published Feb. 17, 2019, Retrieved Sep. 12, 2024, URL <https://youtu.be/QkVMHnH8P4Q?t=299>, Relevant timestamps 4:59-5:00, 7:07-7:09, 8:02-8:25 (Year: 2019).*

(Continued)

*Primary Examiner* — Kito R Robinson
*Assistant Examiner* — Zachary E. F. Glade
(74) *Attorney, Agent, or Firm* — Young Basile Hanlon & MacFarlane, P.C.

(57) ABSTRACT

A controller for an unmanned aerial vehicle may have a top portion configured to interface with a user and a bottom portion on a side opposite the top portion. A device support may be coupled to the controller. The device support may be configured to hold a portable electronic device. The device support may be movable between a closed position in which the device support is received in the bottom portion of the controller and an open position in which the device support extends away from the controller.

20 Claims, 14 Drawing Sheets

(51) Int. Cl.
  *H04M 1/04* (2006.01)
  *H04M 1/72409* (2021.01)
(52) U.S. Cl.
  CPC .... *H04M 1/72409* (2021.01); *H05K 7/20136* (2013.01); *H05K 7/2039* (2013.01); *B64U 2201/20* (2023.01); *G05D 1/0011* (2013.01); *H01Q 21/28* (2013.01); *H04M 1/04* (2013.01)
(58) Field of Classification Search
  CPC .. G05D 1/0011; H04M 1/04; H04M 1/72409; H01Q 1/1235; H01Q 21/28; H01Q 1/22; B64U 2101/30; B64U 2201/20; A63H 30/02
  See application file for complete search history.

(56) References Cited

U.S. PATENT DOCUMENTS

| | | | | |
|---|---|---|---|---|
| 11,420,741 | B2* | 8/2022 | Deng | G05D 1/0011 |
| 2014/0364232 | A1* | 12/2014 | Cramer | A63F 13/98 463/37 |
| 2015/0174482 | A1* | 6/2015 | Hirshberg | A63F 13/92 463/37 |
| 2016/0355263 | A1* | 12/2016 | Pozzi | B64D 11/00152 |
| 2017/0265313 | A1* | 9/2017 | Deng | F16C 11/10 |
| 2019/0287387 | A1* | 9/2019 | Keller | F16M 11/041 |
| 2020/0088344 | A1* | 3/2020 | Tsuji | F16M 11/38 |
| 2022/0230936 | A1* | 7/2022 | Zhong | H01L 25/0652 |
| 2022/0326705 | A1* | 10/2022 | Thompson | B64C 39/024 |
| 2023/0228365 | A1* | 7/2023 | Watanabe | F16M 13/04 248/122.1 |

OTHER PUBLICATIONS

"CN112771590—DescriptionMachineTranslation.pdf"—Machine Translation of the Description section of CN 112771590 into English, retrieved through Espacenet on Sep. 18, 2024 (Year: 2021).*

"CN208300209U—DescriptionMachineTranslation.pdf"—Machine Translation of the Description section of CN 208300209 into English, retrieved through Espacenet on Sep. 18, 2024 (Year: 2018).*

* cited by examiner

US 12,414,260 B2

CONTROLLER FOR UNMANNED AERIAL VEHICLES

CROSS-REFERENCE TO RELATED APPLICATION(S)

This application claims priority to and the benefit of U.S. Provisional Patent Application Ser. No. 63/309,848, filed Feb. 14, 2022, the entire disclosure of which is hereby incorporated by reference.

FIELD

This disclosure relates generally to unmanned aerial vehicles (UAVs) and, more specifically, to a controller for a UAV.

BACKGROUND

A UAV is an aircraft that can fly without a human operator onboard. The flight of a UAV may be controlled by a human operator using a wireless controller to communicate with the UAV.

BRIEF DESCRIPTION OF THE DRAWINGS

This disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION OF THE DRAWINGS

Figure 1:
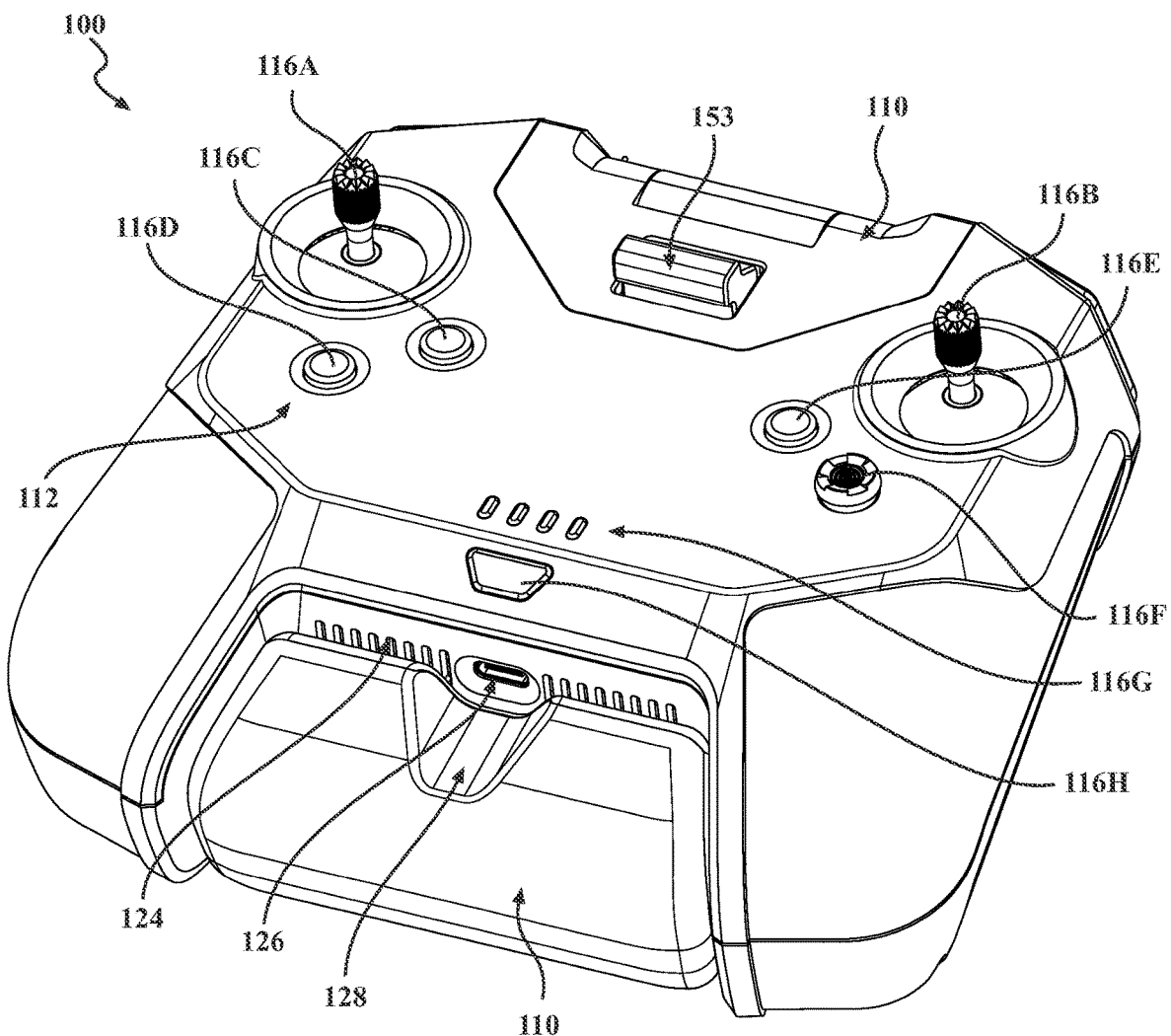
FIGS. 1-2 are isometric views of an example of a controller for a UAV in which the controller includes a device support in a closed position.

To control an unmanned aerial vehicle (UAV), a human operator (also referred to as a "user") may use a portable electronic device (or simply "device"), such as a smart phone or tablet, in conjunction with a wireless UAV controller (or simply "controller"). The user may provide inputs to, and may receive outputs from, an application executing on the device. The device may communicate with the controller, and the controller may communicate with a UAV, such as via communications circuitry connected to one or more outwardly extending antennas.

It may be desirable at times to transport and/or store the controller when the controller is not being used. However, the system used to connect the device to the controller, and/or the antennas used by the controller, may make transportation and/or storage difficult. For example, the system used to connect the device to the controller may be bulky or awkward for transportation and/or storage, and the outwardly extending antennas may be susceptible to damage should the controller be dropped. A need therefore exists to improve the system used to connect the device to the controller, and/or to improve the antennas used by the controller, to better facilitate transportation and/or storage.

Additionally, during assembly, it may be desirable to install different communications circuitry in the controller. For example, the communications circuitry used by the controller to communicate with a UAV in a first geographic region (e.g., the United States) may be different than the communications circuitry used by the controller to communicate with a UAV in a second geographic region (e.g., Europe). However, the arrangement of other circuitry in the controller (e.g., power circuitry used to receive and distribute electrical power, and/or processing circuitry used to provide intelligent control of the system), and the arrangement of cooling systems in the controller (e.g., fans and/or heatsinks), may make changing the communications circuitry difficult. Moreover, the limited space available inside the controller, which may be reduced in size to be conveniently held by a user, may make including variations of the communications circuitry impractical. A need therefore exists to improve the assembly of controller to permit the efficient assembly (e.g., the efficient method of assembly) and/or exchange of circuitry arranged inside.

Implementations of this disclosure address problems such as these by coupling a device support (e.g., a rotatable, telescoping arm) to a controller. The device support may be configured to hold a portable electronic device of various sizes, such as a smart phone, mini tablet, or full size tablet. The device support may be movable between a "closed" position in which the device support is received in a bottom portion of the controller (e.g., in a cavity in the bottom portion), such as when the controller is not in use, and an "open" position in which the device support extends away from the controller, such as when the controller is in use. The bottom portion of the controller may be on a side opposite the top portion of the controller. The top portion may be configured to interface with the user for controlling the UAV. For example, the top portion may include control elements accessible to the user, such as buttons, directional pads, light emitting diodes (LEDs), and joysticks (e.g., accessible by a user's thumbs), while the bottom portion may include an ergonomic grip surface for holding the controller (e.g., accommodating a user's hands on opposing sides of the controller 100). Moving the device support to under the controller when not in use (e.g., folding, swinging, or collapsing underneath) may permit greater ease of transportation and/or storage. Moreover, moving the device support to under the controller may permit the top portion of the controller to be configured for interfacing with a user while reducing undesirable interference with the control elements included in the top portion (e.g., such as an undesirable cavity on the top portion for receiving the device support). In some implementations, a device support hinge may be arranged between the controller and the device support for rotating the device support under the controller (e.g., from the open position to the closed position). In some implementations, one or more antennas for communicating with the UAV may be integrated in the device support. Moving the device support from the closed position to the open position may permit angling the antennas upward and/or outward in a direction overhead toward a UAV.

In some implementations, a support stand may be coupled to the controller. The support stand may be configured to support the controller at an angle relative to a surface, such as when the controller is resting on table, desk, or another platform. The device support may be configured to cause the support stand to be received in the bottom portion of the controller when in the closed position (e.g., the device support may pull the support stand into a cavity defined by bottom portion). The device support may also be configured to permit the support stand to automatically extend away from the controller (e.g., to support the controller on a platform) when in the open position. In some implementations, one or more antennas for communicating with the UAV may be integrated in the support stand. Moving the device support from the closed position to the open position may permit angling the antennas, integrated in the support stand, outward in a direction overhead toward a UAV when the controller is held by a user and in use. Moving the device support from the open position to the closed position may cause a retraction of the antennas inward when the controller is not in use. Thus, moving the device support from the open position to the closed position may improve protection of the antennas from environmental conditions.

In some implementations, a fan and first and second heatsink portions may be arranged in the controller. The first and second heatsink portions may be configured to cool first and second components arranged in the controller, respectively, such as the first heatsink portion cooling a first component comprising communications circuitry implemented on a communications board (e.g., a first printed circuit board (PCB)) and the second heatsink portion cooling a second component comprising power and/or processing circuitry implemented on a second circuit board (e.g., a second PCB). The first and second heatsink portions may be adjacent to one another, and the fan may generate an airflow between the first and second heatsink portions. In some implementations, fins of the first heatsink portion may be interleaved with fins of the second heatsink portion with air gaps in between. This may permit ease of access to the components, such as the component comprising communications circuitry on the communications board, for changing the components during assembly, without moving other components (e.g., the component comprising power and/or processing circuitry) and/or the cooling system (e.g., the fan or the heatsink portions).

Figure 2:
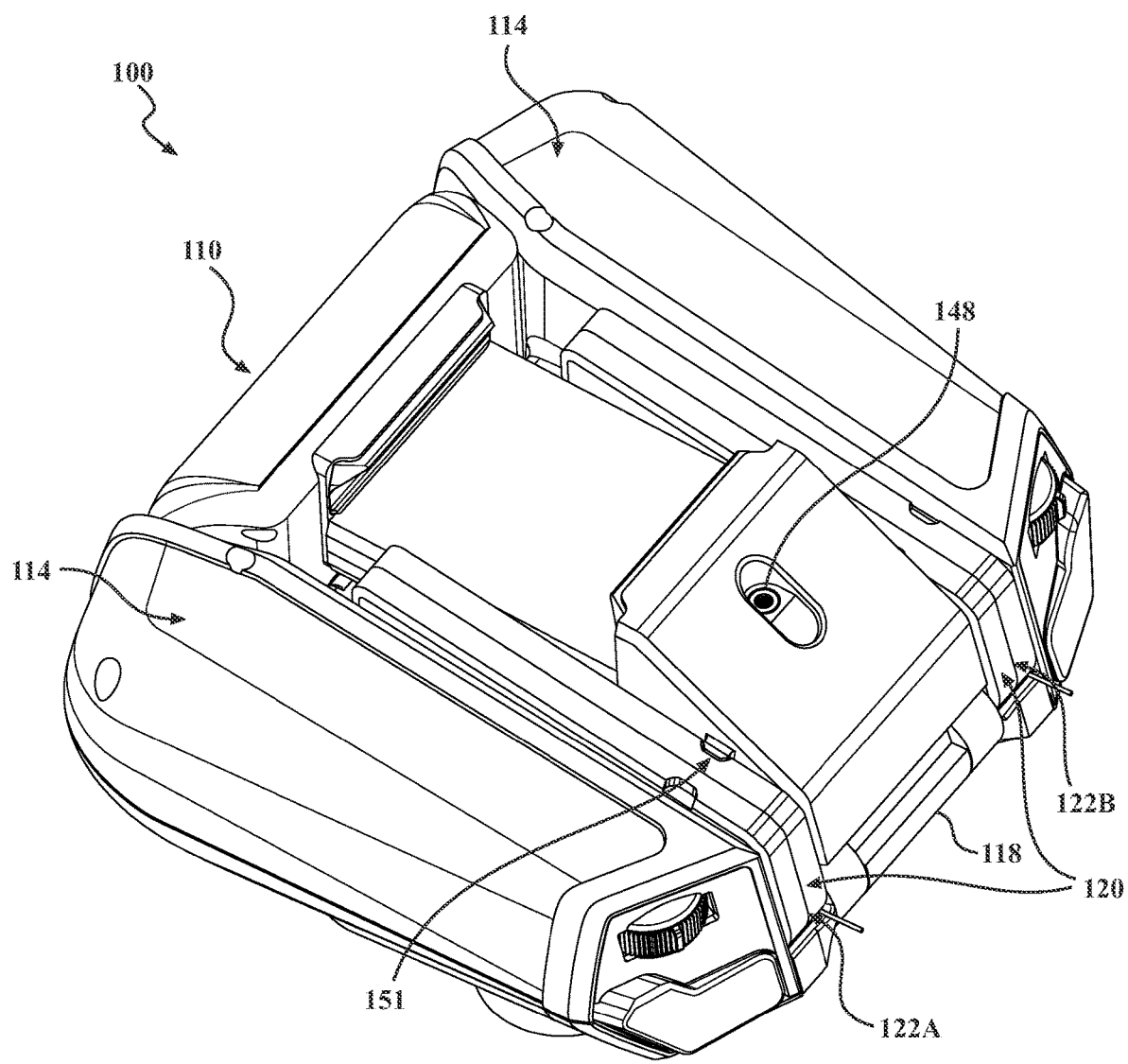

FIGS. 1-2 are isometric views of an example of a controller 100 for a UAV in which the controller 100 includes a device support 110 in a closed position. The controller 100 may be a handheld wireless UAV controller that is configured to be operated by a user to control a UAV. The device support 110, which may be swingable, foldable, rotatable, and/or telescoping, may receive an attachment or adapter. The device support 110 may be configured to hold a portable electronic device of various sizes, such as different sizes of a smart phone. The attachment or adapter may permit the device support 110 to hold a greater number of sizes for the portable electronic device, such as a mini tablet or full size tablet. The device support 110 may be movable between a "closed" position in which the device support 110 is received in a bottom portion 114 of the controller 100 (e.g., shown in FIG. 2, received in a cavity in the bottom portion 114 to at least partialy form an exterior surface of the bottom portion 114), and an "open" position in which the device support 110 extends away from the controller 100 (e.g., shown in FIGS. 3 and 4). The closed position may be used when the controller 100 is not in use, and the open position may be used when the controller 100 is in use.

The bottom portion 114 of the controller 100 (e.g., shown in FIG. 2) may be on a side opposite a top portion 112 of the controller 100 (e.g., shown in FIG. 1). The top portion 112 may be configured to interface with a user for controlling the UAV. For example, top portion 112 may include control elements 116A-116H accessible to the user, such as buttons, directional pads, LEDs, and joysticks (e.g., accessible by a user's thumbs), while the bottom portion 114 may include an ergonomic grip surface for holding the controller 100 (e.g., accommodating a user's hands on opposing sides of the controller 100). In one example, the control elements 116A and 116B may comprise joysticks; the control elements 116C, 116D, and 116E may comprise buttons (e.g., for interfacing with an application executing on the device when attached by the device support 110, and/or a return to home button for the UAV); the control element 116F may comprise a multi-directional pad; the control element 116G may comprise LEDs (e.g., status indicators for power); and the control element 116H may comprise a power button for the controller 100.

It may be desirable at times to transport and/or store the controller 100 when the controller 100 is not being used. Moving the device support 110 to under the controller 100 when the controller 100 is not in use (e.g., folding, swinging, or collapsing underneath) may permit greater ease of transportation and/or storage of the controller 100. Moreover, moving the device support 110 to under the controller 100 may permit the top portion 112 of the controller 100 to be configured for interfacing with a user while reducing undesirable interference with the control elements 116A-116H included in the top portion 112 (e.g., such as an undesirable cavity on the top portion 112 for receiving the device support 110).

In some implementations, a device support hinge (e.g., the device support hinge 118, shown in FIGS. 4-6) may be arranged between the controller 100 and the device support 110 for rotating the device support 110 relative to the controller 100 (e.g., from the open position to the closed position, and from the closed position to the open position). Thus, the closed position may be associated with transportation and/or storage of the controller 100, and the open position may be associated with use of the controller 100. In the closed position, the device support 110 may be received in the bottom portion 114 of the controller 100. For example, the device support 110 may fit in a central cavity of the bottom portion 114 when in the closed position. In the open position, the device support 110 may extend away from the bottom portion 114 of the controller 100. Moving the device support 110 to under the controller 100 when the controller 100 in not use may permit greater ease of transportation and/or storage of the controller 100. Moreover, the top portion 112 of the controller 100 may be configured for interfacing with a user without involving modifications for accommodating the device support 110.

Figure 4:
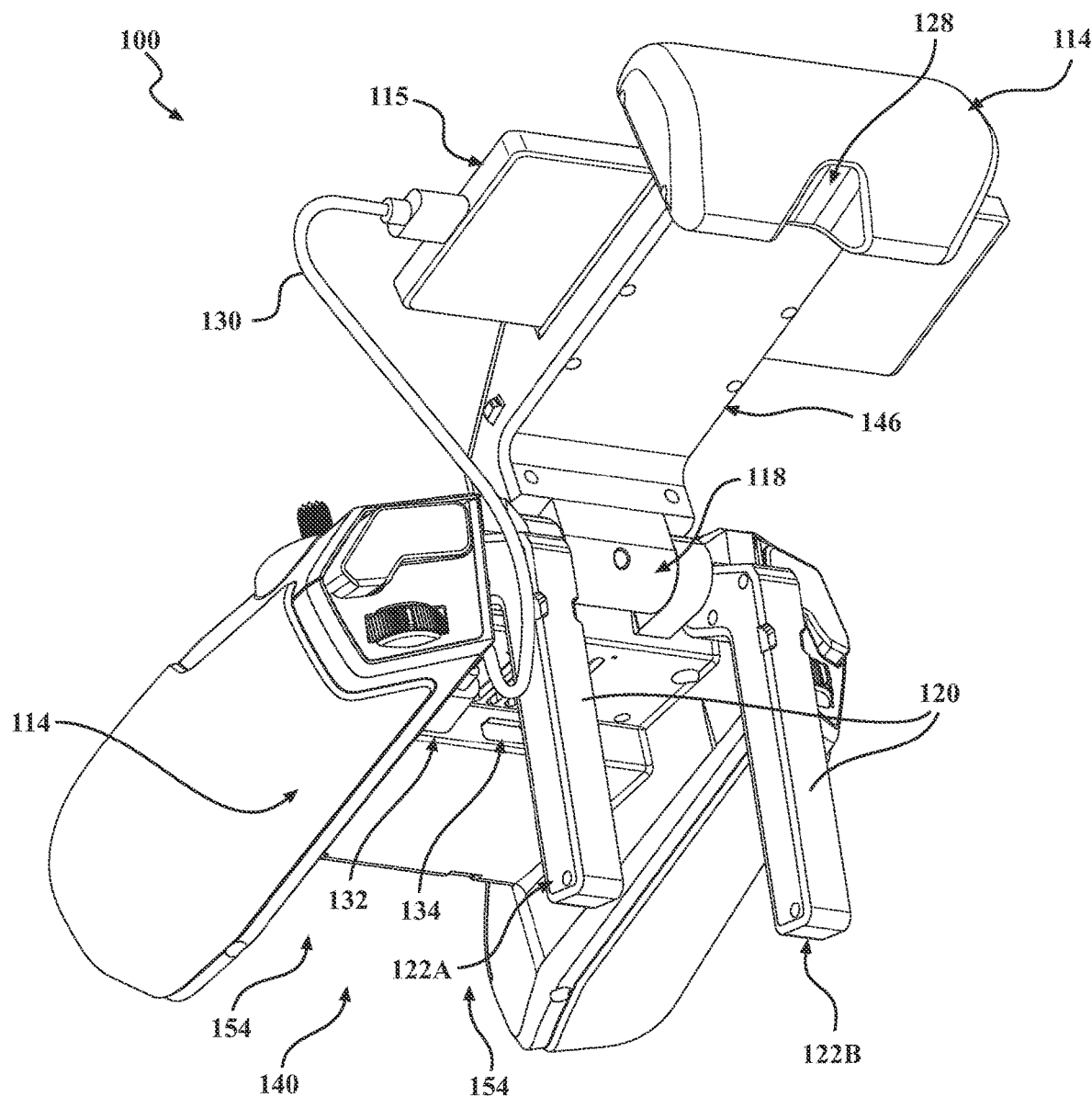

In some implementations, as may be best seen in FIGS. 2 and 4, a support stand 120 may be coupled to the controller 100. The support stand 120 may be configured to support the controller 100 at an angle relative to a surface, such as when the controller 100 is resting on table, desk, or another platform. This may permit a user to use the controller 100, and use a device held by the controller 100, without the user physically holding the controller 100. The support stand 120 may comprise individual support legs, such as support legs 122A and 122B. The device support 110 may be configured to cause the support stand 120 to be received in the bottom portion 114 of the controller 100 when in the closed position. For example, the device support 110 may pull the support legs 122A and 122B of the support stand 120 into side-cavities 154 in the bottom portion 114. The device support 110 may also be configured to permit the support stand 120 to automatically extend away from the controller 100, such as to support the controller 100 on a platform when in the open position. For example, the support legs 122A and 122B of the support stand 120 may be spring loaded, and the device support 110 may release the support legs 122A and 122B from the side-cavities 154 in the bottom portion 114 when the device support 110 is moved to the open position.

In some implementations, as may be best seen in FIG. 1, the device support 110 may be configured to lock into a front portion 124 of the controller 100 when in the closed position. Moving the device support 110 from the closed position to the open position may involve pulling the device support 110 away from the front portion 124 of the controller 100 (e.g., unlocking the device support 110 from the front portion 124) and rotating the device support 110 about the device support hinge 118 (e.g., extending the device support 110 away from the controller 100 by rotating the device support 110 downward from the controller 100 and then back upward over the controller 100 for using a device attached thereto). In some implementations, the front portion 124 may include a port 126 (e.g., a charging port, such as a universal serial bus (USB) port). The device support 110 may include a channel 128 to permit access to the port 126 when the device support 110 is in the closed position (e.g., locked into the front portion 124). This may permit charging the controller 100, and a device attached thereto via the device support 110, including when the controller 100 is in the closed position and not in use.

In some implementations, the controller 100 may include a global positioning system (GPS) device arranged inside the controller 100. For example, the GPS device may be in addition to any GPS device provided by the device 115. The GPS device may be used to recall a UAV to a precise location corresponding to the controller 100, such as by a single press of one of the control elements 116C, 116D, and 116E (e.g., a single press of the control element 116D, which could be a return to home button for the UAV).

Figure 3:
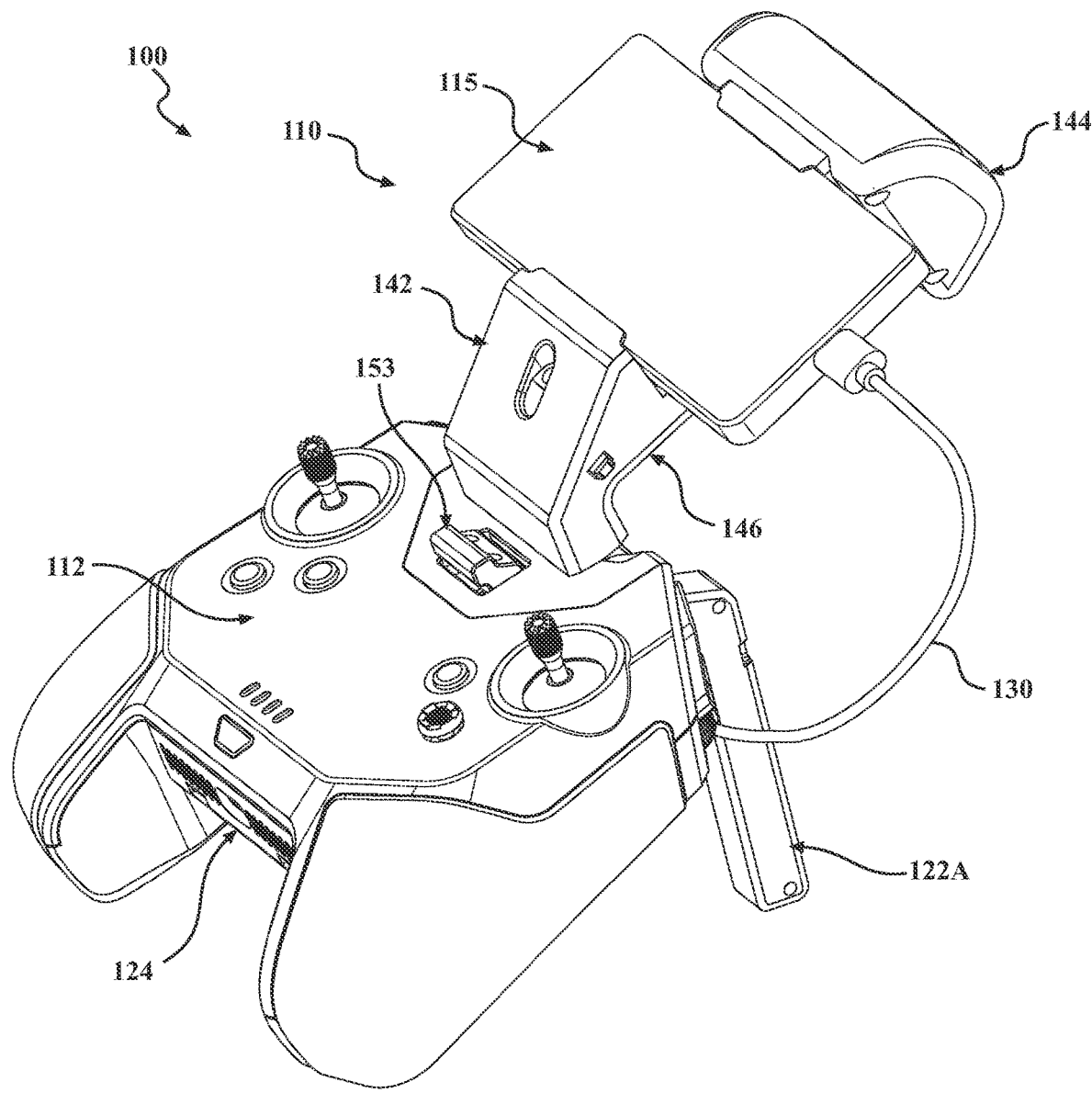
FIGS. 3-4 are isometric views of an example of a controller for a UAV in which the controller includes a device support, shown holding a portable electronic device, in an open position.

FIGS. 3-4 are isometric views of an example of the controller 100 in which the controller 100 includes the device support 110, shown holding a device 115. The device 115 may, for example, be a portable electronic device, such as a smart phone. To control a UAV, a user may use the device 115 in conjunction with the controller 100. In some implementations, the device 115 may have a cable 130 connecting the device 115 to a port 132 on the controller 100 (e.g., a USB port on the bottom portion 114 of the controller 100). The cable 130, and thus the port 132, may be used to provide power to the device 115, and/or to control an application executing on the device 115 (e.g., such as via the one or more of the control elements 116A-116H). For example, when in use, the user may provide inputs to, and may be exposed to outputs from, an application executing on the device 115. The device 115 may communicate with the controller 100, via the cable 130, and the controller may communicate with a UAV, such as via communications circuitry connected to one or more outwardly extending antennas.

In some implementations, the device 115 may communicate wirelessly with the controller 100 (e.g., without the cable 130). In some implementations, the controller 100 may also include a port 134 for providing a video output (e.g., a high-definition multimedia interface (HDMI) port on the bottom portion 114 of the controller 100, for displaying video captured by the UAV). In some implementations, the device 115 may remain attached to the device support 110, and the cable 130 may remain connected between the device 115 and the controller 100, in both the open position and the closed position. For example, the bottom portion 114 of the controller 100 may include recesses for accommodating the device 115 and/or the cable 130 when in the closed position.

Figure 5:
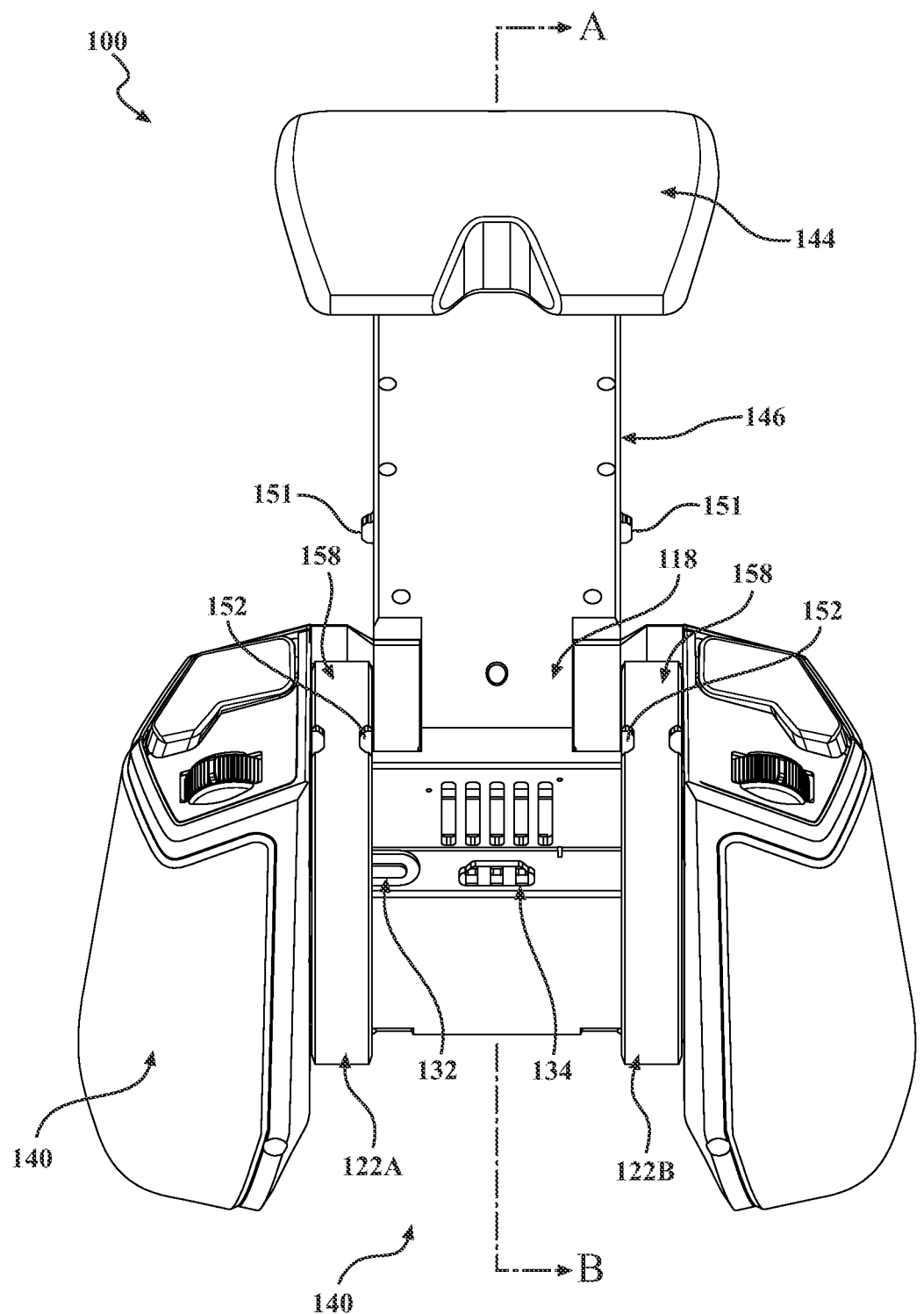
FIG. 5 is an isometric view of an example of a controller having a device support, shown without a portable electronic device, in an open position.
Figure 6:
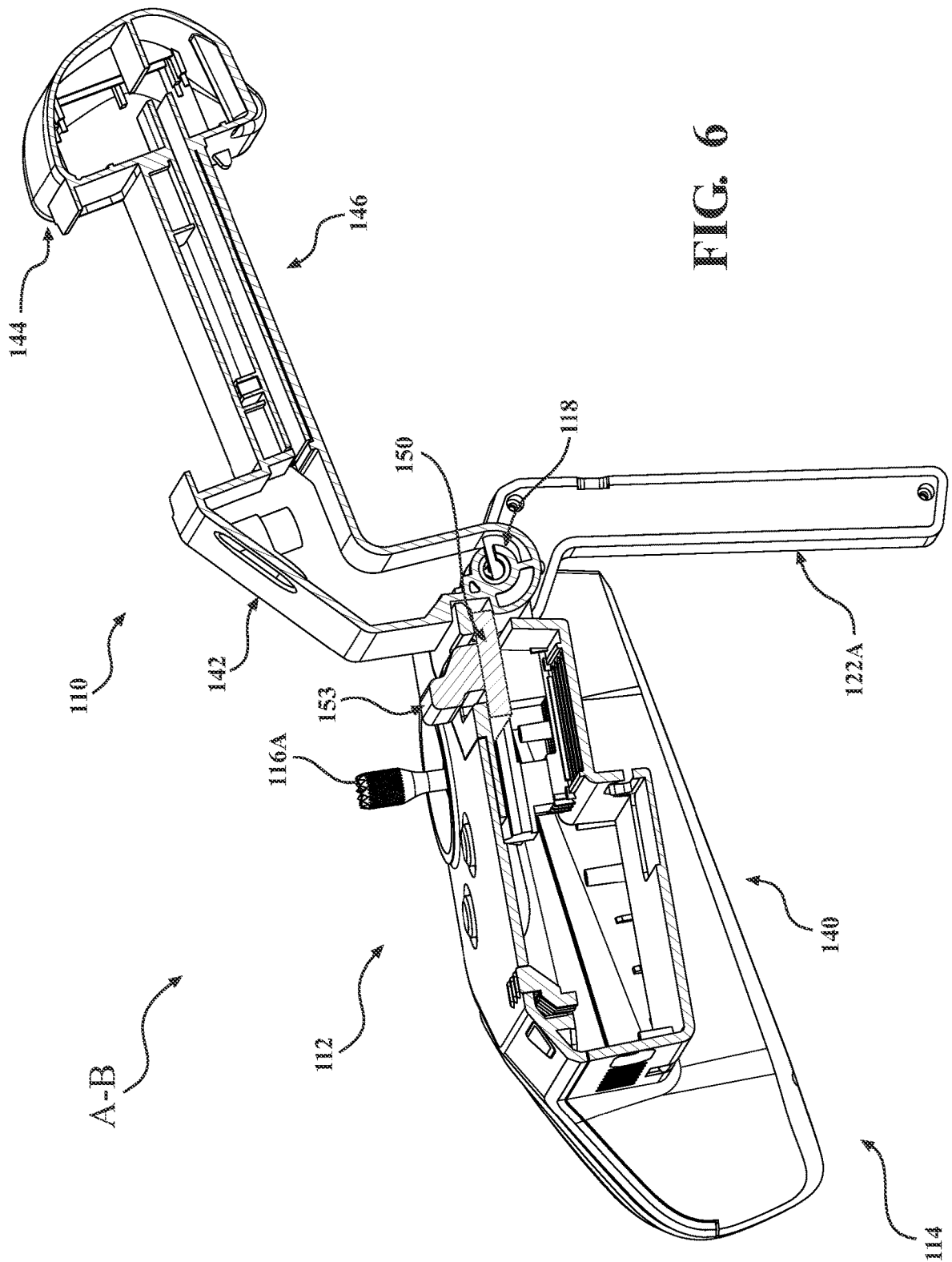
FIG. 6 is a cross section of an isometric view of an example of a controller having a device support, shown without a portable electronic device, in an open position.

With additional reference to FIGS. 5-6 (e.g., showing views of the controller 100 in the open position and without the device 115), the controller 100 may include the device support hinge 118 arranged between the controller 100 and the device support 110. The device support hinge 118 may permit rotating the device support 110 from under the controller 100 (e.g., from the closed position, as shown in FIGS. 1-2) to over the controller 100 (e.g., to the open position, as shown in FIGS. 3-4), such as for when the controller 100 is in use. The device support hinge 118 may also permit rotating the device support 110 back from over the controller 100 (e.g., from the open position, as shown in FIGS. 3-4) to under the controller 100 (e.g., to the closed position, as shown in FIGS. 1-2), such as for when the controller 100 is not in use. The bottom portion 114 of the controller 100 may include a central cavity 140 for receiving the device support 110 when the device support 110 is in the closed position.

In some implementations, as may be best seen in FIG. 6, the device support 110 may include a lower clamp portion 142, an upper clamp portion 144, and an arm 146 in between. The lower clamp portion 142 and the upper clamp portion 144 may be used to clamp (e.g., to securely hold or attach, such as with tension) the device 115 to the device support 110. In some implementations, the lower clamp portion 142 may be stationary on a lower portion of the arm 146 (e.g., proximal to the controller 100), while the upper clamp portion 144 may be moveable along an upper portion of the arm 146 (e.g., distal to the controller 100). In some implementations, the arm 146 may be a spring loaded telescoping arm to permit holding different sizes of a portable electronic device (e.g., different sizes of a smart phone) between the lower clamp portion 142 and the upper clamp portion 144. For example, the upper clamp portion 144 may be pulled away from the lower clamp portion 142 along the arm 146, working against a spring, so that the device 115 may be installed between the upper clamp portion 144 and the lower clamp portion 142. A spring may pull the upper clamp portion 144 and the lower clamp portion 142 back together, against the device 115, to hold the device 115 in position. Thus, the device support 110 may be extendable to multiple positions for holding different sizes of the device 115. As may be seen in FIG. 2, the lower clamp portion 142 and the upper clamp portion 144 may be external to the controller when the device support 110 is in the closed position. In some cases, this may permit the device support 110 to continue to hold the device 115 when the device support 110 is in the closed position.

In some implementations, and as may be best seen in FIG. 2, the device support 110 may also include a device mounting system 148 for securely attaching the device 115 when a larger portable electronic device is used. For example, the device mounting system 148 may comprise a recess for receiving an adapter for holding a larger portable electronic device (e.g., larger than a smartphone), such as a mini tablet or full size tablet (e.g., including sizes up to 10 inches in diameter). In some implementations, the device 115 may remain securely attached to the device support 110, even when the controller 100 is in the closed position (e.g., in addition to being securely attached when the controller 100 is in the open position). In some implementations, an attachment or adapter may be added to the device support 110, so that the device support 110 may hold a greater number of sizes for the device 115.

In some implementations, the device support 110 may be rigidly locked into place when fully extended in the open position. For example, and as may be best seen in FIG. 6, showing a cross section A-B from FIG. 5, moving the device support 110 to the open position may actuate a locking system 150 that is configured to lock the device support 110 in the open position when the device support 110 is fully extended. The locking system 150 may engage with a rotatable feature of the device support hinge 118 to permit moving to the open position and locking in the open position. A release 153 (e.g., a mechanical, slidable button), which may be arranged above the locking system 150, may be configured to release the device support 110 from the open position (e.g., unlock the device support 110 from the open position), so that the device support 110 can freely rotate back to the closed position. In some implementations, the release 153 may actuate the locking system 150 (e.g., pull the locking system 150 rearward), so that the locking system 150 disengages with the device support hinge 118 to permit the device support hinge 118 to freely rotate the device support 110 back to the closed position.

In some implementations, the support stand 120 may be configured to support the controller 100 at an angle relative to a surface, such as when the controller 100 is resting on table, desk, or another platform. This may permit a user to use the controller 100, and thus the device 115, without the user physically holding the controller 100. The device support 110 may be configured to cause the support stand 120 to also be received in the bottom portion 114 of the controller 100 when in the closed position. For example, as may be best seen in FIG. 5, tabs 151 of the device support 110 may engage with grooves 152 (e.g., pockets) of the support legs 122A and 122B to pull the support legs 122A and 122B into side-cavities 154 in the bottom portion 114. The support legs 122A and 122B may rotate via a support stand hinge 158, and the device support 110 may be used to control such rotation. The device support 110 may also be configured to permit the support stand 120 to automatically extend away from the controller 100, such as to support the controller 100 on a platform when in the open position. For example, when moving the device support 110 to the open position, the tabs 151 of the device support 110 may release from the grooves 152 of the support legs 122A and 122B to permit the support legs 122A and 122B to resiliently extend from the side side-cavities 154 back outward to the open position (e.g., rotating about the support stand hinge 158). For example, the support legs 122A and 122B may be spring loaded, so that the support legs 122A and 122B may move by default to the open position, away from the side side-cavities 154.

Figure 7:
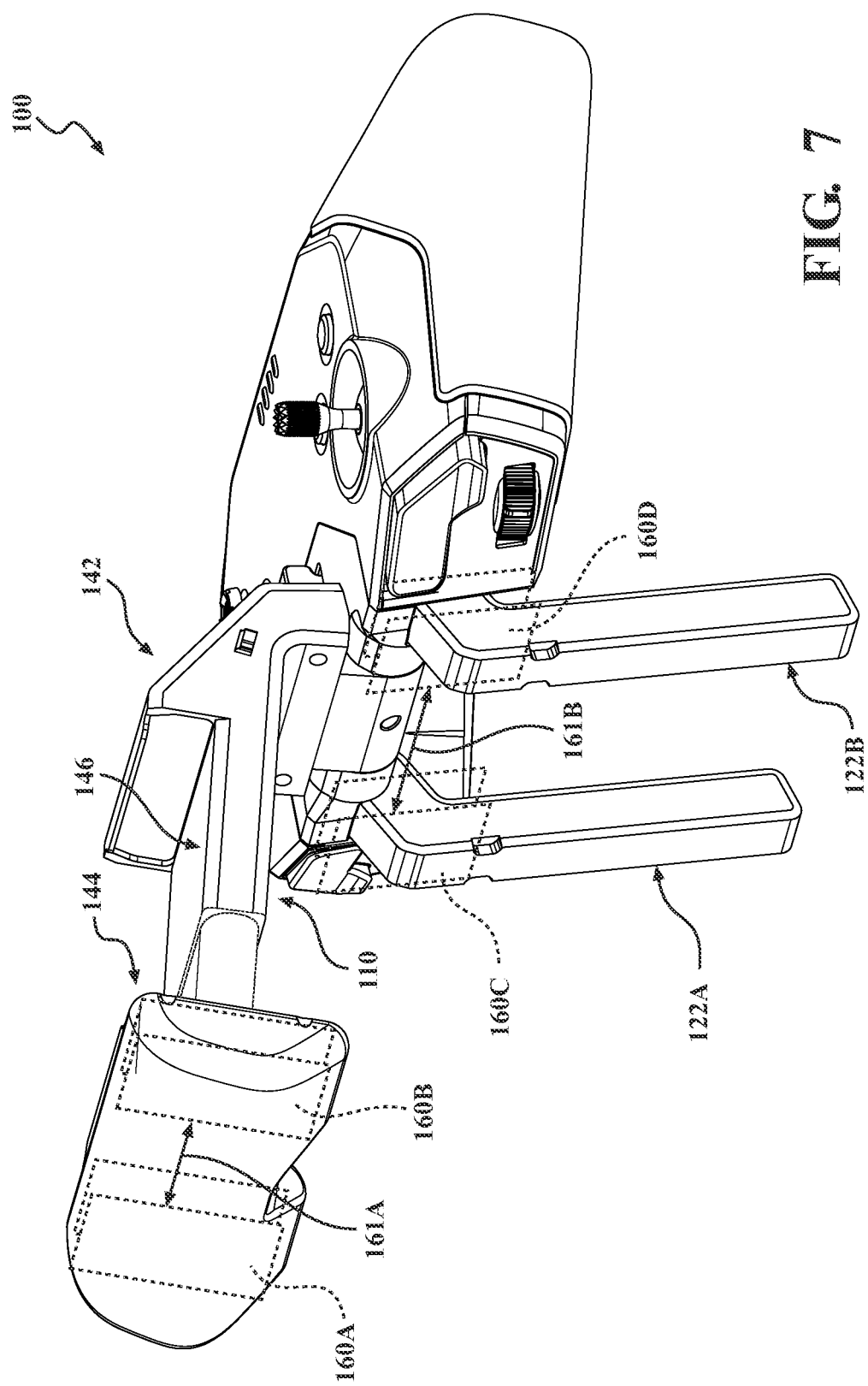
FIG. 7 is an isometric view of an example of a controller with antennas for communicating with a UAV.

FIG. 7 is an isometric view of an example of the controller 100 with antennas for communicating with a UAV. The device support 110 and the support stand 120 are shown in the open position and without a device attached (e.g., without the device 115). The controller 100 may include one or more antennas for communicating with the UAV, such as antennas 160A-160D. The antennas 160A-160D may be connected to communications circuitry in the controller 100 for communicating with a UAV. For example, the antennas 160A-160D may be connected to a component 176 (e.g., shown in FIGS. 9 and 10) comprising communications circuitry that is arranged inside the controller 100.

The antennas may be integrated in the device support 110 and/or the support stand 120. For example, the antennas 160A and 160B may be integrated in the device support 110, such as in the upper clamp portion 144. Moving the device support 110 from the closed position to the open position may permit angling the antennas 160A and 160B upward and/or outward in a direction overhead toward a UAV. Also, the antennas 160C and 160D may be integrated in the support stand 120, such as in the support legs 122A and 122B, respectively. Moving the device support 110 from the closed position to the open position may also permit angling the antennas 160C and 160D, integrated in the support stand 120, outward in a direction overhead toward a UAV when the controller 100 is held by a user. Additionally, moving the device support from the open position to the closed position may improve protection of the antennas 160A-160D from environmental conditions, such as by pulling and/or locking the antennas 160A and 160B (e.g., integrated in the device support 110) and the antennas 160C and 160D (e.g., integrated in the support stand 120) in the bottom portion 114 of the controller 100. Further, the antennas 160A-160D may be extended away from the controller 100 when in the open position, into a fixed, known orientation, so that a user's hands do not contact the antennas 160A-160D or otherwise interfere with the antennas 160A-160D. Also, the antennas 160A-160D may be extended with horizontal separation (e.g., a horizontal separation 161A, between the antennas 160A and 160B in the device support 110, and a horizontal separation 161B, between the antennas 160C and 160D in the support stand 120) and with vertical separation (between the antennas 160A and 160B in the device support 110, arranged upward, and the antennas 160C and 160D in the support stand 120, arranged downward) for improved communication with a UAV.

In some implementations, the antennas 160A-160D may be used to communicate via different frequency bands. For example, the antennas 160A and 160B in the device support 110 may be used to communicate via 2.4 GHz Wi-Fi (e.g., based on the IEEE 802.11 family of standards), and the antennas 160C and 160D in the support stand 120 may be used to communicate via 5 GHz Wi-Fi.

FIGS. 8-12 are views of an example of the controller 100 with a fan 170 (e.g., a blower fan) and heatsink portions, such as heatsink portions 172 and 174, arranged inside the controller 100. During assembly of the controller 100, it may be desirable to install different communications circuitry in the controller 100. For example, as may be best seen in FIGS. 9 and 10, the component 176 may comprise communications circuitry used by the controller 100 to communicate with a UAV in a first geographic region (e.g., the United States). It may be desirable to exchange the component 176 with a component comprising different communications circuitry to communicate with a UAV in a second geographic region (e.g., Europe). However, the arrangement of other circuitry in the controller, such as a component 178 comprising power and/or processing circuitry (e.g., power circuitry used to receive and distribute electrical power in the controller 100, processing circuitry used to provide intelligent control of the controller 100, and/or a GPS device used to recall a UAV to a precise location of the controller 100), may make changing the component 176 difficult. Moreover, the limited space available inside the controller 100, which may be reduced in size to be conveniently held by a user, may make including variations of the components (e.g., variations of communications circuitry) impractical. Thus, the fan 170 and the heatsink portions 172 and 174 may be configured in the controller 100 to permit ease of access to the component 176, such as for changing the communications circuitry.

In some implementations, the heatsink portions 172 and 174 may comprise a single heatsink. For example, the single heatsink may have an open channel in the middle to permit an airflow to pass therethrough. In some implementations, the heatsink portions 172 and 174 may comprise multiple heatsinks. For example, the multiple heatsinks may be physically joined on sides with an open channel in the middle to permit an airflow to pass therethrough. In some implementations, the heatsink portions 172 and 174 may include thermal interface material (e.g., between a heatsink portion and a component). In some implementations, the heatsink portions 172 and 174 may include fins for dissipating heat.

Figure 9:
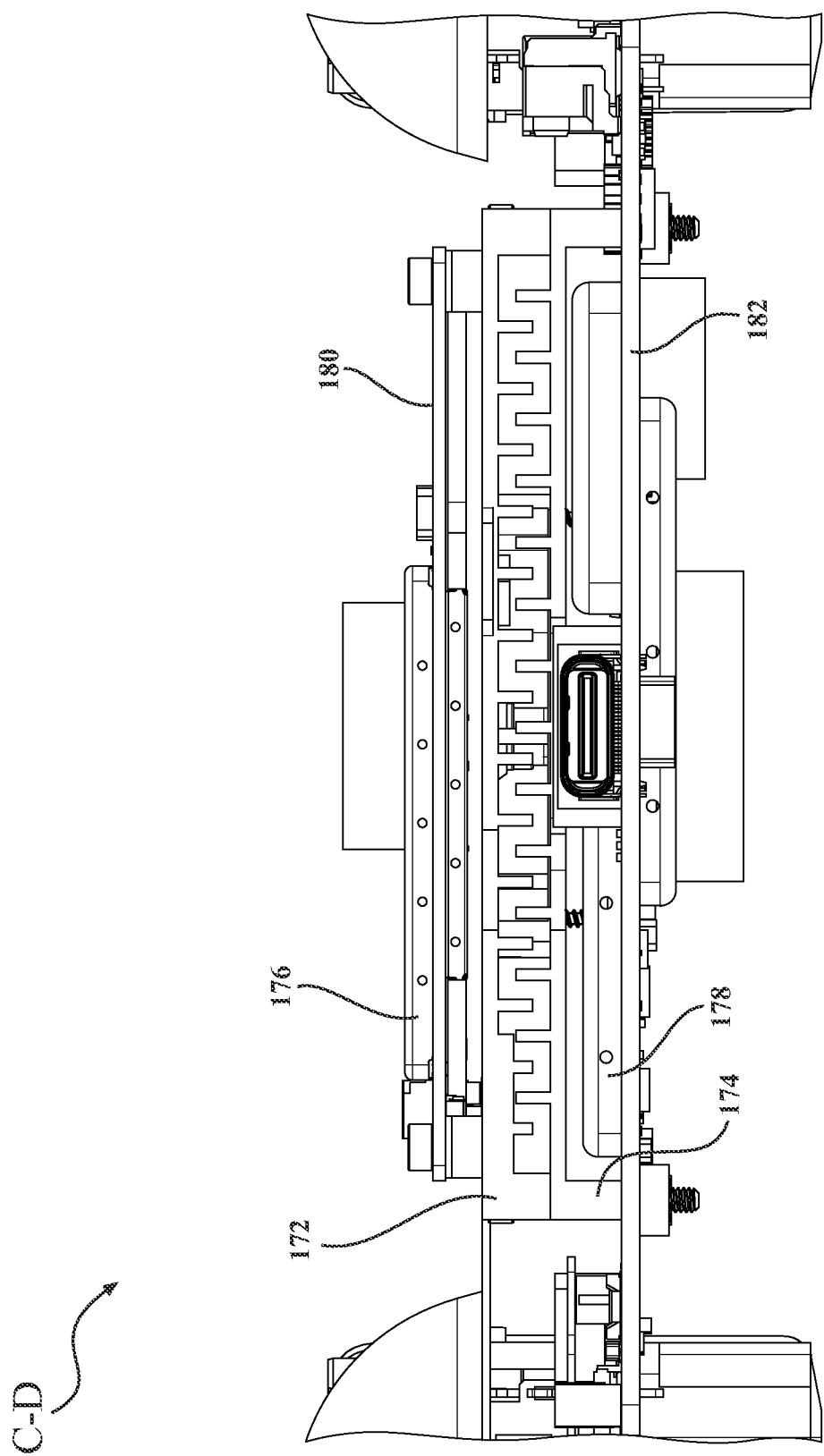
Figure 10:
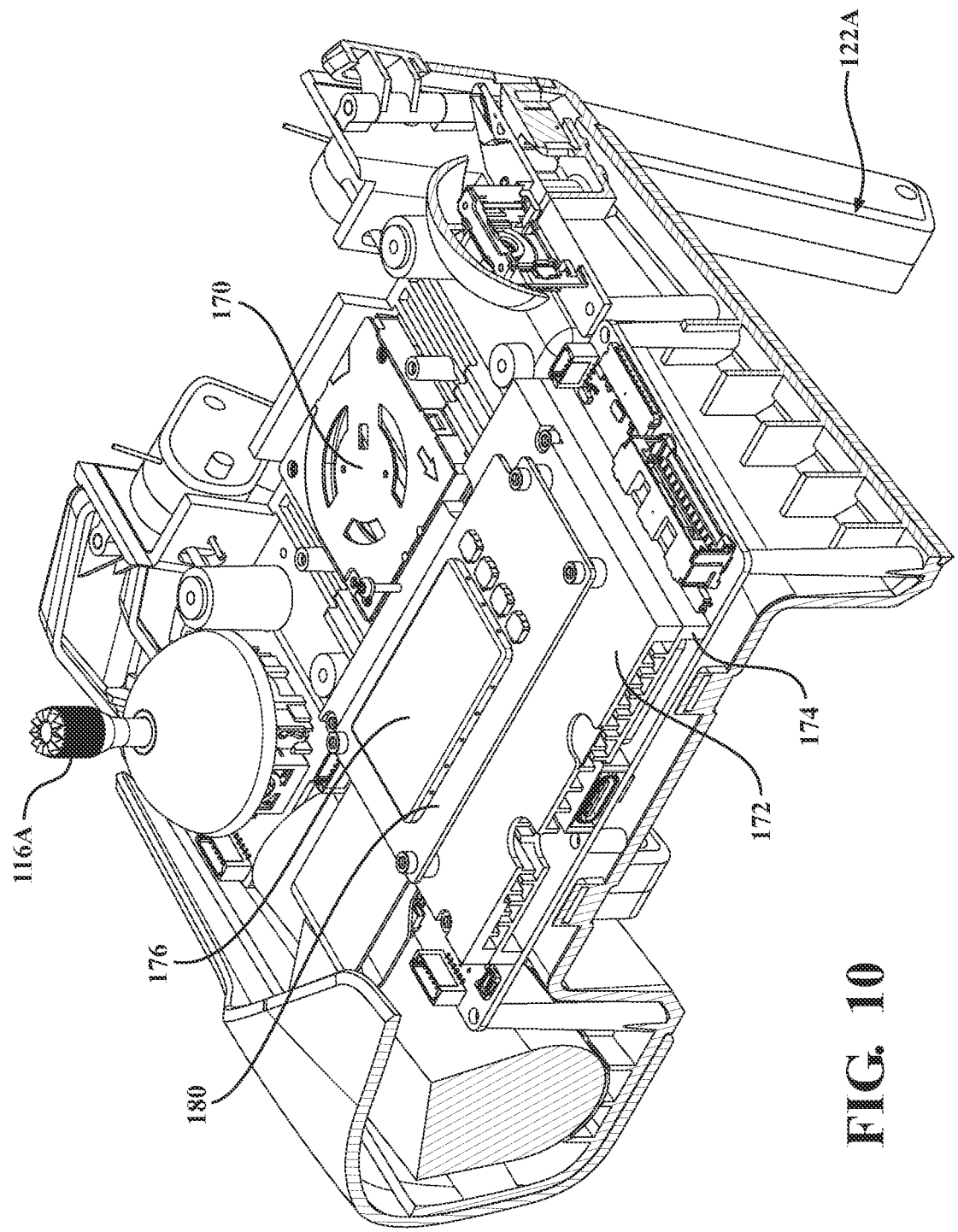
Figure 11:
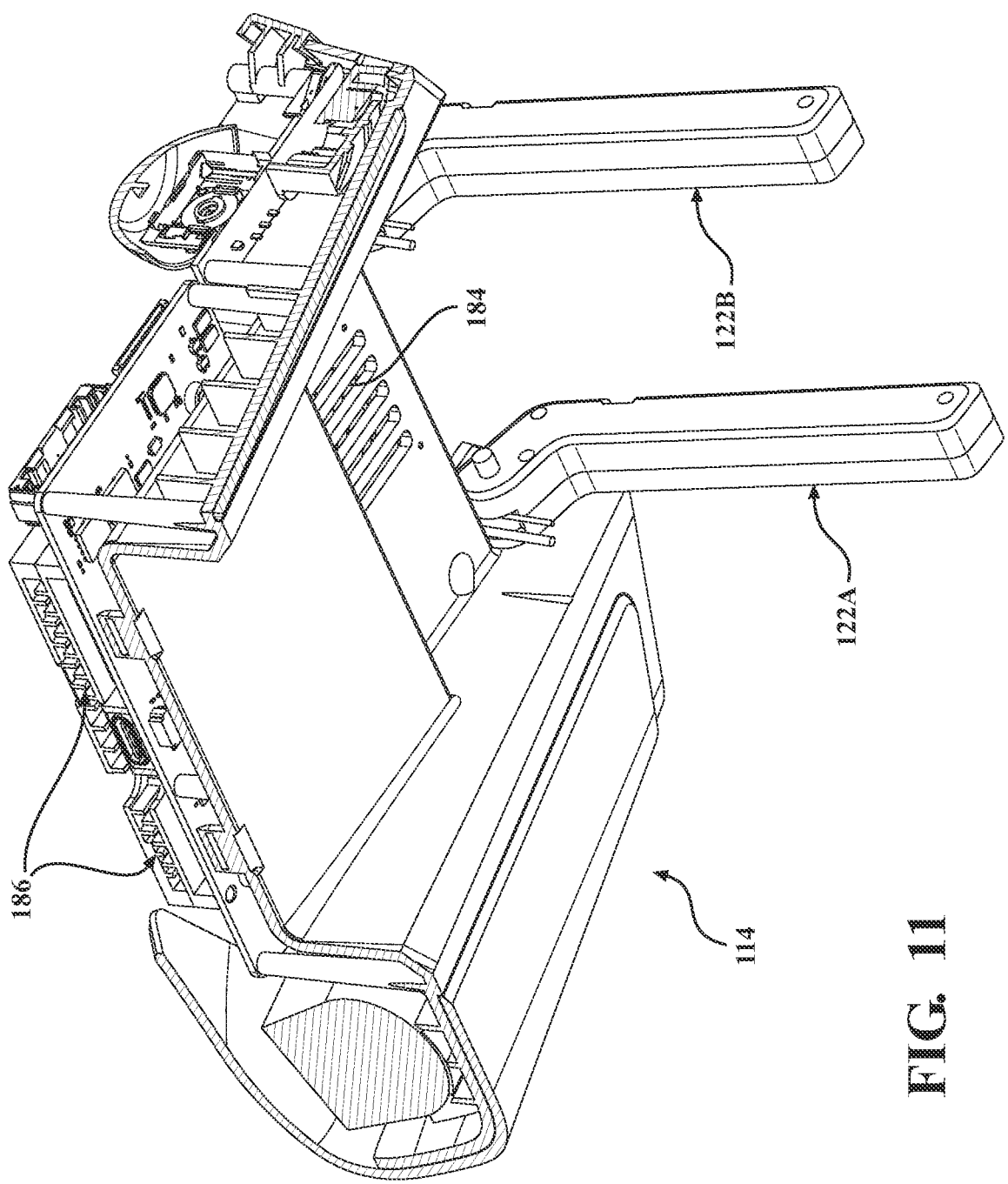
Figure 12:
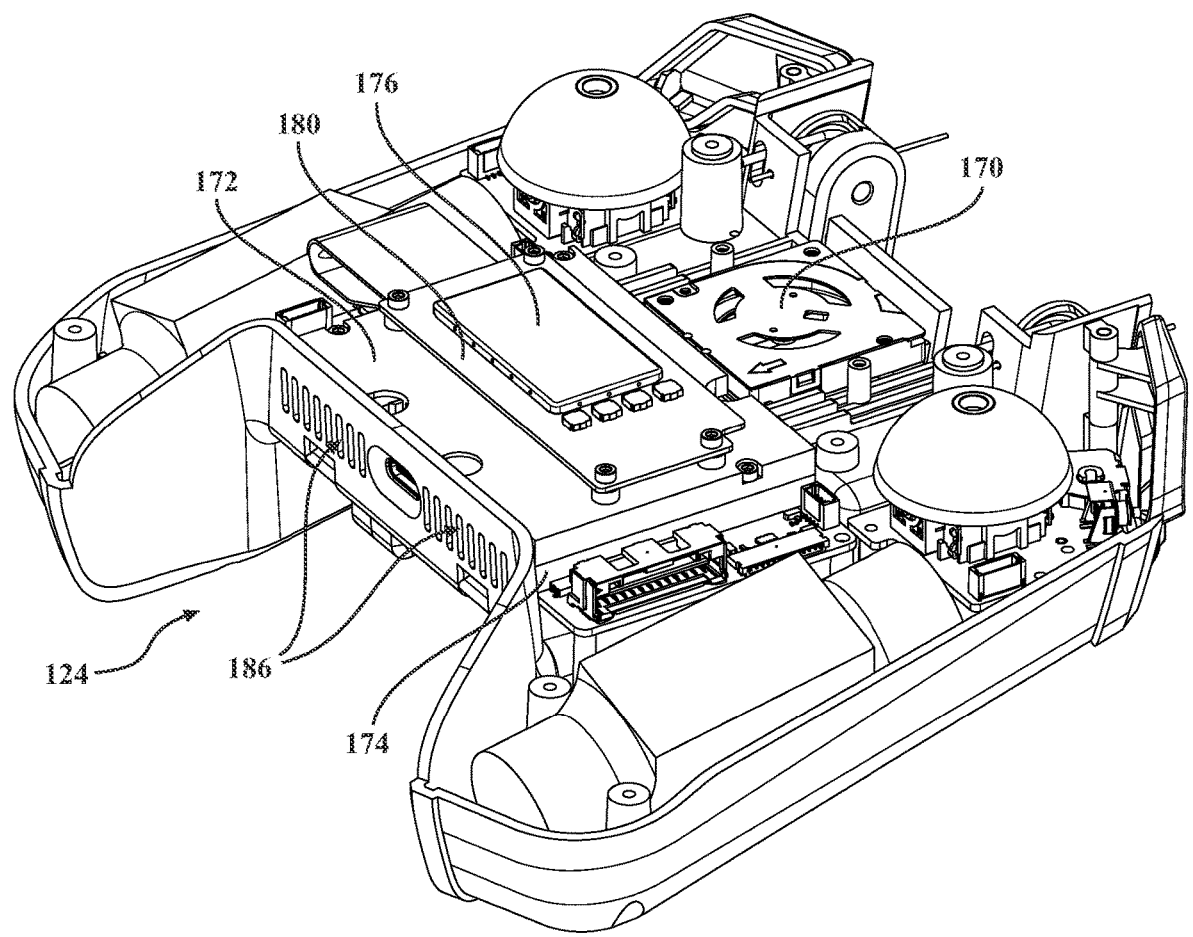

As may be best seen in FIG. 9, the heatsink portions 172 and 174 may be configured to cool circuitry arranged in the controller 100 in different planes, such as the heatsink portion 172 cooling the component 176 (e.g., comprising the communications circuitry) in an upper plane, and the heatsink portion 174 cooling the component 178 (e.g., comprising the power and/or processing circuitry) in a lower plane. The heatsink portion 172 may cool the component 176 implemented on a communications board 180 in the upper plane (e.g., a radio board, which may be secondary PCB and which may be wired to antennas such as the antennas 160A-160D), and the heatsink portion 174 may cool the component 178 implemented on a power and/or processing board 182 in the lower plane (e.g., a main board, which maybe a primary PCB and which may be wired to ports such as the port 126, the port 132, and the port 134). The heatsink portions 172 and 174 may be mounted to the boards, such as via fasteners (e.g., screws and/or retaining clips). For example, the heatsink portion 172 may be mounted to the communications board 180, and the heatsink portion 174 may be mounted to the power and/or processing board 182, via one or more fasteners.

The heatsink portions 172 and 174 may be adjacent to one another, and the fan 170 may generate an airflow between the heatsink portions 172 and 174 adjacent to one another. For example, as may be best seen in FIG. 11, the airflow may ingress from an inlet 184 arranged in the bottom portion 114 of the controller 100, and the inlet 184 may be exposed to ambient air when in the open position. Also, as may be best seen in FIG. 12, the airflow may egress (e.g., exhaust) at an outlet 186 arranged in the front portion 124 of the controller 100 that remains at least partially unobstructed by the controller 100 or components thereof, which may also be exposed to ambient air when in the open position. The fan 170 may generate the airflow from the inlet 184, turn the airflow 90 degrees, force the airflow between the heatsink portions 172 and 174, and exhaust the airflow at the outlet 186, to move heated air out of the controller 100. For example, the fan 170 and the heatsink portions 172 and 174 may use forced convection to dissipate heat from the components 176 and 178. The fan 170 may generate the airflow when the controller is in the open position (e.g., when the controller is being used to control a UAV).

Figure 8:
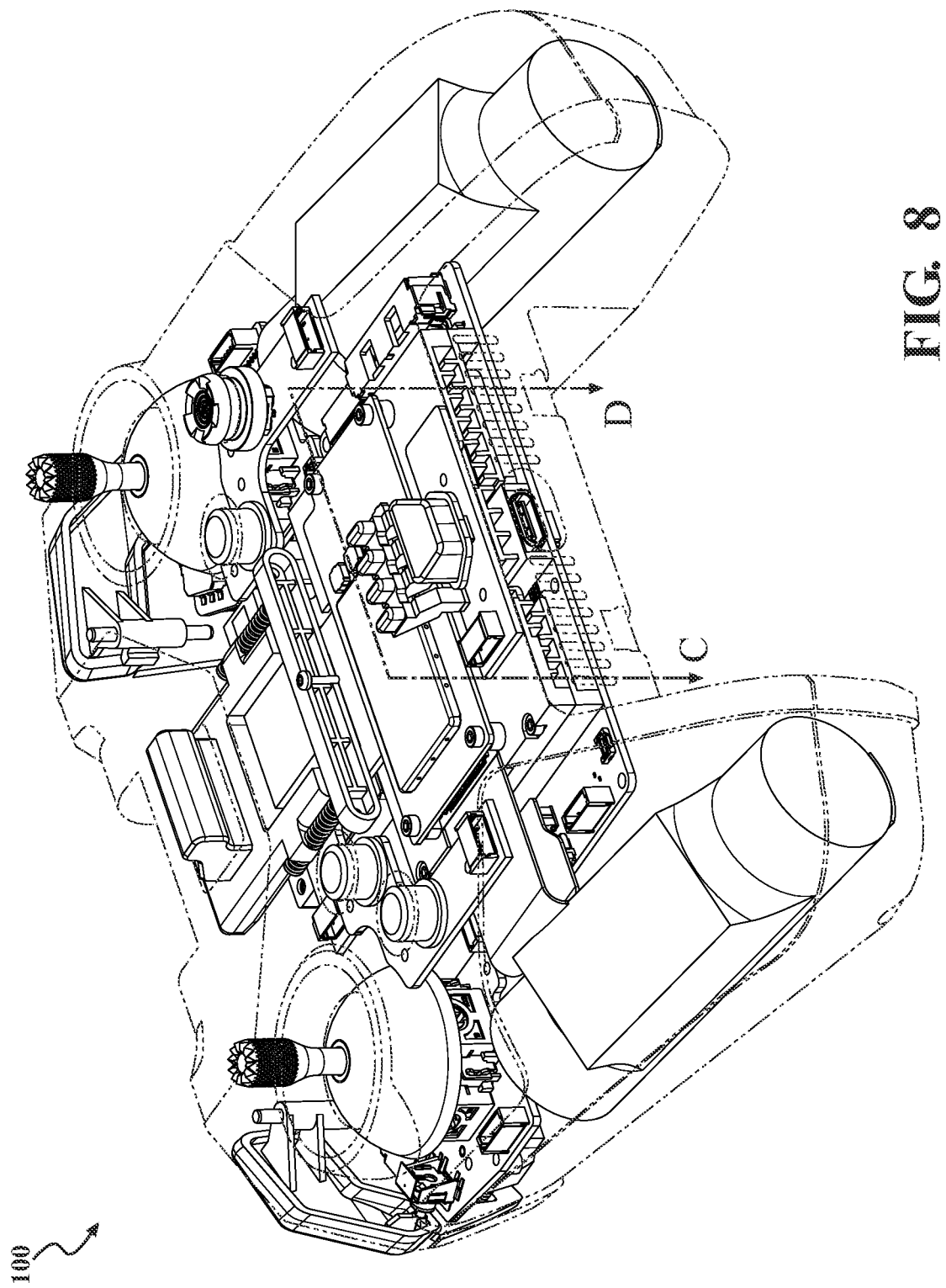
FIGS. 8-12 are views of an example of a controller with a fan and heatsink portions for cooling circuitry arranged inside.

In some implementations, as may be best seen in FIG. 9, a cross section C-D from FIG. 8, fins of the heatsink portion 172 may be interleaved with fins of the heatsink portion 174 with air gaps in between the fins. This may permit tightly fitting the heatsink portions 172 and 174 in the limited space available inside the controller 100, while providing ease of access to components, such as the component 176 (e.g., comprising the communications circuitry).

Figure 13:
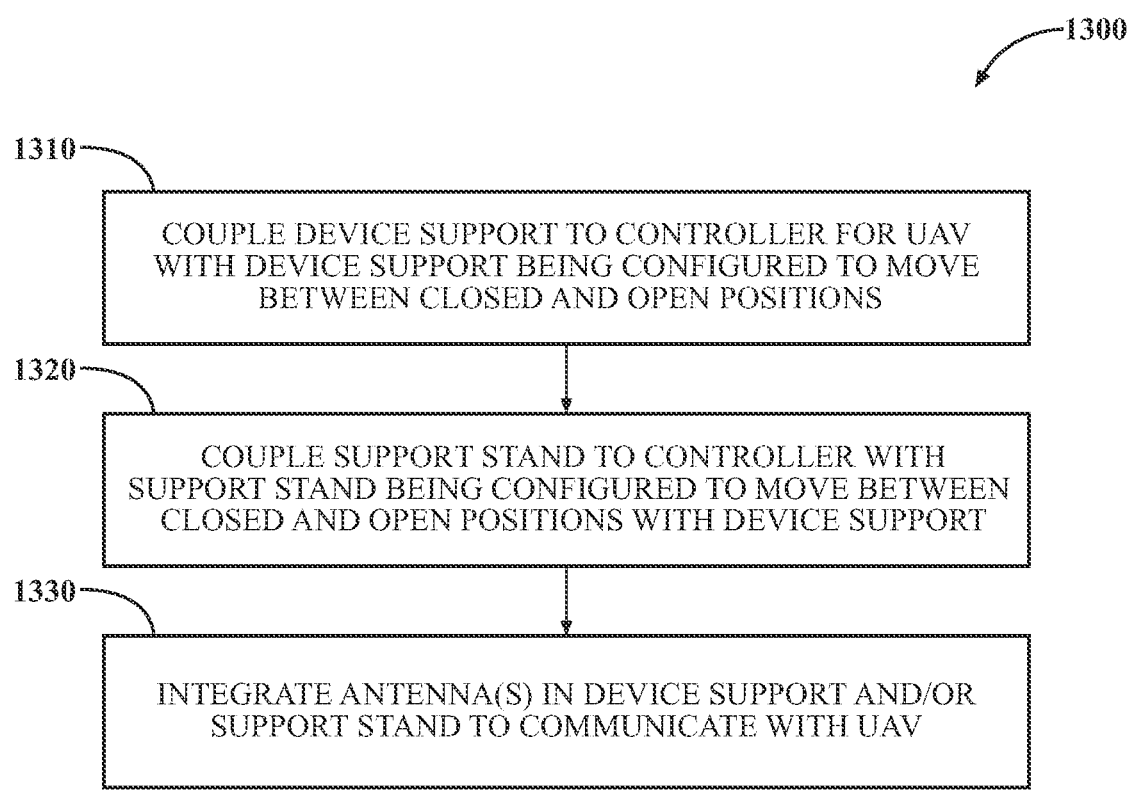
FIG. 13 is a flowchart of an example of a process for implementing a controller that includes a device support and a support stand.

FIG. 13 is a flowchart of an example of a process 1300 for implementing a controller (e.g., the controller 100) in which the controller includes a device support (e.g., the device support 110) and a support stand (e.g., the support stand 120). The process 1300 may include coupling 1310 a device support to a controller for a UAV in which the device support is configured to move between closed and open positions. The device support may be swingable, foldable, rotatable, and/or telescoping. The device support may be configured to hold a portable electronic device of various sizes, such as different sizes of a smart phone, and in some cases with an adapter, a mini tablet or a full size tablet (e.g., including sizes up to 10 inches in diameter). The device support may be movable between a closed position in which the device support is received in a bottom portion of the controller and an open position in which the device support extends away from the controller 100. The closed position may be used when the controller is not in use, and the open position may be used when the controller is in use. In some implementations, a device support hinge (e.g., the device support hinge 118) may be arranged between the controller and the device support for rotating the device support relative to the controller (e.g., from an open position to a closed position, and from a closed position to an open position). In the closed position, the device support may be received in the bottom portion of the controller. For example, the device support may fit in a central cavity of the bottom portion when in the closed position. In the open position, the device support may extend away from the bottom portion of the controller 100.

The process 1300 may also include coupling 1320 a support stand to the controller with the support stand being configured to move between open and open positions with the support stand. The support stand may be configured to support the controller at an angle relative to a surface, such as when the controller is resting on table, desk, or another platform. This may permit a user to use the controller, and use a device held by the controller, without the user physically holding the controller. The support stand may comprise individual support legs. The device support may be configured to cause the support stand to be received in the bottom portion of the controller when in the closed position. For example, the device support may pull the support legs of the support stand into side-cavities in the bottom portion. The device support may also be configured to permit the support stand to automatically extend away from the controller, such as to support the controller on a platform when in the open position. For example, the support legs may be spring loaded, and the device support may release the support legs from the side-cavities in the bottom portion when the device support 110 is moved to the open position.

The process 1300 may also include integrating 1330 one or more antennas (e.g., the antennas 160A-160D) in the device support and/or the support stand to communicate with a UAV. For example, the antennas may be connected to a component comprising communications circuitry that is arranged inside the controller. The antennas may be integrated in the device support, such as in an upper clamp portion (e.g., the upper clamp portion 144). Moving the device support from the closed position to the open position may permit angling the antennas upward and/or outward in a direction overhead toward a UAV. Also, the antennas may be integrated in the support stand, such as in the support legs. Moving the device support from the closed position to the open position may also permit angling the antennas, integrated in the support stand, outward in a direction overhead toward a UAV when the controller is held by a user. Additionally, moving the device support from the open position to the closed position may improve protection of the antennas from environmental conditions, such as by pulling and/or locking the antennas (e.g., integrated in the device support) and the antennas (e.g., integrated in the support stand) in the bottom portion of the controller. Further, the antennas may be extended away from the controller when in the open position, into a fixed, known orientation, so that a user's hands do not contact the antennas or otherwise interfere with the antennas. Also, the antennas may be extended with horizontal separation and with vertical separation for improved communication with a UAV.

Figure 14:
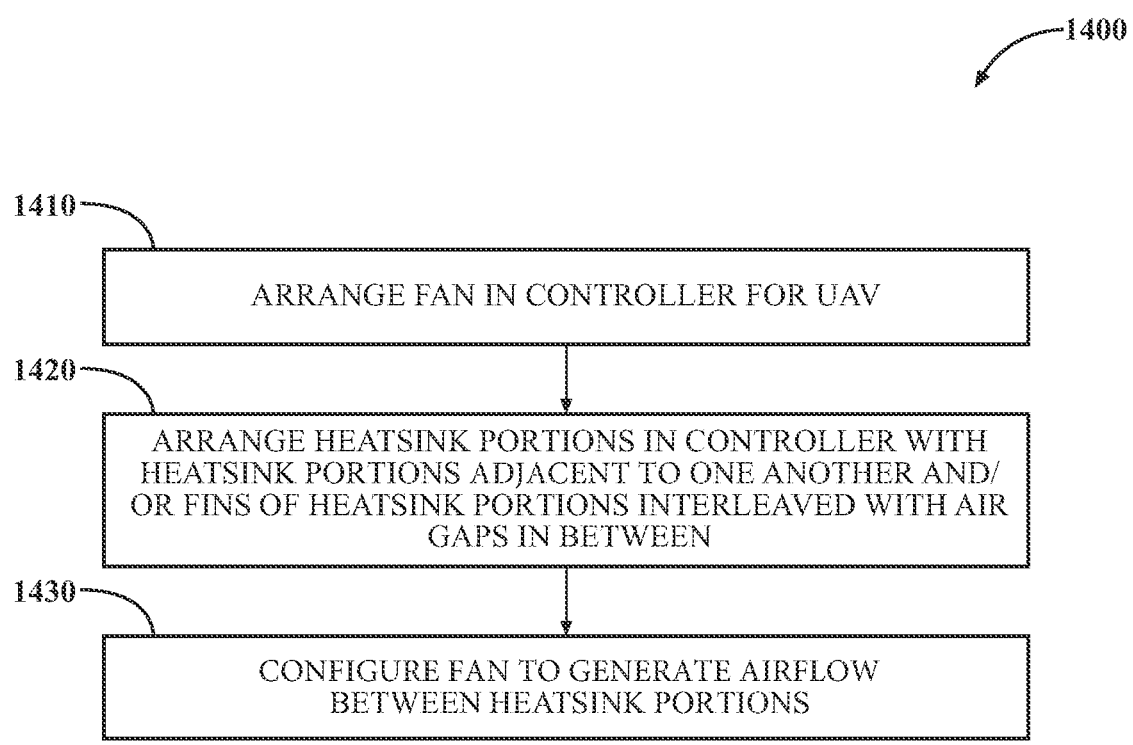
FIG. 14 is a flowchart of an example of a process for implementing a controller that includes a fan and heatsink portions for cooling circuitry arranged inside.

FIG. 14 is a flowchart of an example of a process 1400 for implementing a controller (e.g., the controller 100) in which the controller includes a fan (e.g., the fan 170) and heatsink portions (e.g., heatsink portions 172 and 174) arranged inside. The process 1400 may include arranging 1410 a fan in a controller for a UAV. The fan could be a blower fan configured to generate an airflow in the controller. For example, the fan may be configured to generate the airflow from an inlet, turn the airflow 90 degrees, force the airflow between the heatsink portions, and exhaust the airflow at an outlet, to move heated air out of the controller.

The process 1400 may also include arranging 1420 heatsink portions in the controller with heatsink portions adjacent to one another and/or fins of the heatsink portions interleaved with air gaps in between. For example, the heatsink portions may be adjacent to one another, and the fan may be configured to generate an airflow between the heatsink portions adjacent to one another. In some implementations, fins of the heatsink portions (e.g., for dissipating heat) may be interleaved with one another with air gaps in between the fins. This may permit tightly fitting the heatsink portions in the limited space available inside the controller, while providing ease of access to components, such as a component comprising the communications circuitry. In some implementations, the heatsink portions may comprise a single heatsink. For example, the single heatsink may have an open channel in the middle to permit the airflow to pass therethrough. In some implementations, the heatsink portions may comprise multiple heatsinks. For example, the multiple heatsinks may be physically joined on sides with an open channel in the middle to permit the airflow to pass therethrough. In some implementations, the heatsink portions may include thermal interface material (e.g., between a heatsink portion and a component).

The process 1400 may also include configuring 1430 the fan to generate an airflow between the heatsink portions. The fan may be configured to generate the airflow between the heatsink portions that are adjacent to one another. For example, the airflow may ingress from an inlet arranged in a bottom portion of the controller, which inlet 184 may be exposed to ambient air when in the open position. Also, the airflow may egress (e.g., exhaust,exit, etc.) at an outlet arranged in the front portion of the controller, which outlet may also be exposed to ambient air when in the open position. The fan may generate the airflow from the inlet, turn the airflow 90 degrees, force the airflow between the heatsink portions, and exhaust the airflow at the outlet, to move heated air out of the controller. For example, the fan and the heatsink portions may use forced convection to dissipate heat from the components.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law

What is claimed is:

1. An assembly, comprising:
   a controller for an unmanned aerial vehicle (UAV), the controller having a top portion and a bottom portion that defines a cavity;
   a device support coupled to the controller, the device support having a lower clamp portion and an upper clamp portion that are configured to hold a portable electronic device, wherein the device support is movable between a closed position, in which the device support is received in the cavity of the bottom portion and located adjacent to, and external from, the bottom portion such that the device support at least partially forms an exterior surface of the bottom portion, and an open position, in which the device support extends away from the controller;
   a support stand coupled to the controller, the support stand being configured to support the controller at an angle relative to a surface, wherein the support stand is spring loaded such that the device support pulls the support stand into the cavity of the bottom portion of the controller to position the support stand adjacent to the device support in the cavity of the bottom portion when in the closed position and permits the support stand to automatically extend away from the controller when in the open position; and
   antennas for communicating with a UAV, wherein the antennas include a first antenna integrated in the device support and a second antenna integrated in the support stand.

2. The assembly of claim 1, further comprising:
   a device support hinge between the controller and the device support, wherein the device support is configured to rotate between the closed position and the open position via the device support hinge.

3. The assembly of claim 1, wherein the first antenna is integrated in at least one of the lower clamp portion or the upper clamp portion and the second antenna is integrated in a first leg of the support stand, and wherein the assembly further comprises:
   a third antenna integrated in a second leg of the support stand.

4. The assembly of claim 1, further comprising:
   a release arranged on the controller, wherein the device support is configured to lock when in the open position, and wherein the release is configured to unlock the device support for moving the device support from the open position to the closed position.

5. The assembly of claim 1, wherein the support stand includes a support leg that includes a groove, and wherein a tab of the device support is configured to engage the groove to pull the support leg into the cavity of the bottom portion.

6. The assembly of claim 1, wherein the portable electronic device is configured to remain attached to the device support and located in the cavity of the bottom portion when the device support is in the closed position.

7. The apparatus of claim 1, wherein the lower clamp portion and the upper clamp portion are configured on a spring loaded telescoping arm.

8. The apparatus of claim 1, further comprising:
a fan arranged in the controller; and
first and second heatsink portions configured to cool first and second components arranged in the controller, respectively, wherein the first and second heatsink portions are arranged adjacent to one another, and wherein the fan is configured to generate an airflow between the first and second heatsink portions.

9. The assembly of claim 1, further comprising:
first and second heatsink portions configured to cool first and second components arranged in the controller, respectively, wherein the first and second heatsink portions are arranged adjacent to one another, and wherein fins of the first heatsink portion are interleaved with fins of the second heatsink portion with air gaps in between.

10. A system, comprising:
a controller for a UAV, the controller having a top portion, a bottom portion, and a front portion extending between the top portion and the bottom portion, the front portion including a port;
a device support coupled to the controller, the device support being configured to hold a portable electronic device for communicating with the UAV, wherein the device support is movable between a closed position, in which the device support is received in a recess of the bottom portion and the device support is positioned external to the bottom portion, and an open position, in which the device support extends away from the controller, and wherein the device support includes a channel that permits access to the port when the device support is in the closed position;
a support stand coupled to the controller and configured to support the controller, wherein the support stand is configured for positioning adjacent to the device support in the recess of the bottom portion of the controller when the device support is in the closed position; and
first and second heatsink portions configured to cool first and second components arranged in the controller, respectively, wherein the first and second heatsink portions are arranged adjacent to one another to permit an airflow between the first and second heatsink portions.

11. The system of claim 10, further comprising:
a device support hinge between the controller and the device support, wherein the device support is configured to rotate between the closed position and the open position via the device support hinge.

12. The system of claim 10, further comprising:
an antenna for communicating with the UAV, wherein the antenna is integrated in the device support.

13. The system of claim 10, further comprising:
a support stand coupled to the controller, the support stand being configured to support the controller at an angle relative to a surface, wherein the device support causes the support stand to be received in the bottom portion of the controller when in the closed position and the device support permits the support stand to automatically extend away from the controller when in the open position.

14. The system of claim 10, further comprising:
an antenna for communicating with the UAV; and
a support stand coupled to the controller, the support stand being configured to support the controller at an angle relative to a surface, wherein the antenna is integrated in the support stand.

15. The system of claim 10, further comprising:
a fan arranged in the controller wherein the fan is configured to generate an airflow between the first and second heatsink portions.

16. A method, comprising:
coupling a device support to a controller for a UAV, the device support being configured to hold a portable electronic device, and the controller having a top portion, a bottom portion, and a front portion connecting the top portion and the bottom portion, the front portion having an outlet;
coupling a support stand to the controller, the support stand being configured to support the controller at an angle relative to a surface;
configuring first and second heatsink portions to cool first and second components arranged in the controller, respectively, wherein the first and second heatsink portions are arranged adjacent to one another to permit an airflow between the first and second heatsink portions, the airflow configured to exit the controller through the outlet of the front portion; and
moving the device support between a closed position, in which the device support and the support stand are received in the bottom portion of the controller, the device support and the support stand are located adjacent to one another, and at least a portion of the outlet of the top portion remains unobstructed by the device support, and an open position, in which the device support extends away from the controller, wherein the airflow is generated when the controller is in the open position, and wherein the portable electronic device is configured to remain secured by the device support when the device support is located in the closed position and the open position.

17. The method of claim 16, further comprising:
configuring multiple antennas for communicating with a UAV, wherein the multiple antennas include a first antenna integrated in the device support and a second antenna integrated in the support stand.

18. The method of claim 16, further comprising:
configuring a lower clamp portion and an upper clamp portion on the device support so that the lower clamp portion and the upper clamp portion hold a portable electronic device and so that the lower clamp portion and the upper clamp portion are external to the controller when in the closed position.

19. The method of claim 16, further comprising:
configuring a spring with respect to the support stand, wherein the spring causes the support stand to extend away from the controller when the device support is in the open position.

20. The method of claim 16, further comprising:
configuring a fan in the controller wherein the fan generates the airflow between the first and second heatsink portions.

* * * * *